United States Patent
Su et al.

(10) Patent No.: US 9,728,522 B2
(45) Date of Patent: Aug. 8, 2017

(54) INTEGRATED CIRCUIT PACKAGES AND METHODS OF FORMING SAME

(71) Applicant: Taiwan Semiconductor Manufacturing Company, Ltd., Hsin-Chu (TW)

(72) Inventors: An-Jhih Su, Bade (TW); Hsien-Wei Chen, Hsin-Chu (TW)

(73) Assignee: Taiwan Semiconductor Manufacturing Company, Ltd., Hsin-Chu (TW)

(*) Notice: Subject to any disclaimer, the term of this patent is extended or adjusted under 35 U.S.C. 154(b) by 0 days.

(21) Appl. No.: 15/425,859

(22) Filed: Feb. 6, 2017

(65) Prior Publication Data

US 2017/0148768 A1 May 25, 2017

Related U.S. Application Data

(62) Division of application No. 14/555,374, filed on Nov. 26, 2014, now Pat. No. 9,570,322.

(51) Int. Cl.
*H01L 21/00* (2006.01)
*H01L 25/065* (2006.01)
(Continued)

(52) U.S. Cl.
CPC ........ *H01L 25/0657* (2013.01); *H01L 21/486* (2013.01); *H01L 21/561* (2013.01); *H01L 23/3128* (2013.01); *H01L 23/481* (2013.01); *H01L 23/49827* (2013.01); *H01L 24/17* (2013.01); *H01L 24/81* (2013.01); *H01L 24/97* (2013.01); *H01L 25/50* (2013.01); *H01L 2224/0401* (2013.01);
(Continued)

(58) Field of Classification Search
CPC . H01L 2224/48145; H01L 2224/16145; H01L 2224/32145; H01L 2225/06541; H01L 25/0657; H01L 21/486
USPC .................................. 438/107, 108, 109, 110
See application file for complete search history.

(56) References Cited

U.S. PATENT DOCUMENTS 8,710,676 B2    4/2014   Chou et al.
8,754,514 B2    6/2014   Yu et al.
(Continued)

FOREIGN PATENT DOCUMENTS

KR          100836642 B1    6/2008
KR          20110077466 A    7/2011
(Continued)

*Primary Examiner* — S. V. Clark
(74) *Attorney, Agent, or Firm* — Slater Matsil, LLP

(57) ABSTRACT

Packages and methods of manufacture thereof are described. A package may include a first package and a die structure disposed over the first package. The first package may include: a first encapsulant; a first via structure within the first encapsulant; a first die within the first encapsulant, at least a portion of the first encapsulant being interposed between a sidewall of the first die and a sidewall of the first via structure; a second die within the first encapsulant, an active side of the second die facing an active side of the first die; and a first via chip within the first encapsulant, the first via chip comprising one or more through vias, wherein the first via chip is disposed at the active side of the first die, and between the second die and the first via structure.

20 Claims, 11 Drawing Sheets

(51) Int. Cl.
  *H01L 23/31*     (2006.01)
  *H01L 23/48*     (2006.01)
  *H01L 23/498*    (2006.01)
  *H01L 21/48*     (2006.01)
  *H01L 21/56*     (2006.01)
  *H01L 23/00*     (2006.01)
  *H01L 25/00*     (2006.01)

(52) U.S. Cl.
  CPC ............. *H01L 2224/13025* (2013.01); *H01L 2224/16145* (2013.01); *H01L 2224/97* (2013.01); *H01L 2225/06513* (2013.01); *H01L 2225/06541* (2013.01)

(56) References Cited

U.S. PATENT DOCUMENTS

| | | | |
|---|---|---|---|
| 8,901,724 B2* | 12/2014 | Guzek | H01L 21/568 257/686 |
| 9,209,158 B2* | 12/2015 | Pratt | H01L 21/76898 |
| 2011/0037169 A1 | 2/2011 | Pagaila | |
| 2011/0278707 A1* | 11/2011 | Chi | H01L 21/76802 257/676 |
| 2011/0285007 A1 | 11/2011 | Chi et al. | |
| 2011/0309523 A1 | 12/2011 | Takahashi | |
| 2012/0086109 A1 | 4/2012 | Kim et al. | |
| 2012/0193779 A1* | 8/2012 | Lee | H01L 23/3135 257/737 |
| 2012/0211885 A1 | 8/2012 | Choi et al. | |
| 2013/0056871 A1 | 3/2013 | Yu et al. | |
| 2013/0175702 A1 | 7/2013 | Choi et al. | |
| 2014/0110856 A1 | 4/2014 | Lin | |
| 2014/0203457 A1* | 7/2014 | Kim | H01L 25/18 257/778 |
| 2014/0264831 A1 | 9/2014 | Meyer | |
| 2014/0347943 A1 | 11/2014 | Kim et al. | |
| 2015/0028448 A1 | 1/2015 | Hosseini et al. | |
| 2015/0162220 A1 | 6/2015 | Chou et al. | |
| 2015/0187742 A1 | 7/2015 | Kwon et al. | |
| 2015/0303174 A1 | 10/2015 | Yu et al. | |
| 2016/0027764 A1 | 1/2016 | Kim et al. | |
| 2016/0233196 A1 | 8/2016 | Kim et al. | |

FOREIGN PATENT DOCUMENTS

| | | |
|---|---|---|
| KR | 20110123297 A | 11/2011 |
| KR | 20120040039 A | 4/2012 |
| KR | 20130015461 A | 2/2013 |
| KR | 20130082313 A | 7/2013 |
| KR | 101368538 B1 | 2/2014 |
| KR | 20140050507 A | 4/2014 |

* cited by examiner

INTEGRATED CIRCUIT PACKAGES AND METHODS OF FORMING SAME

PRIORITY CLAIM AND CROSS-REFERENCE

This application is a divisional and claims the benefit of U.S. application Ser. No. 14/555,374, filed on Nov. 26, 2014, entitled "Integrated Circuit Packages and Methods of Forming Same," which application is hereby incorporated herein by reference in its entirety.

BACKGROUND

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size (e.g., shrinking the semiconductor process node towards the sub-20 nm node), which allows more components to be integrated into a given area. As the demand for miniaturization, higher speed and greater bandwidth, as well as lower power consumption and latency, has grown recently, there has grown a need for smaller and more creative packaging techniques of semiconductor dies.

As semiconductor technologies further advance, stacked semiconductor devices, e.g., 3D integrated circuits (3DICs), have emerged as an effective alternative to further reduce the physical size of a semiconductor device. In a stacked semiconductor device, wafers/dies are stacked on top of one another and are interconnected using through connections such as through vias (TVs). Some of the benefits of 3DICs, for example, include exhibiting a smaller footprint, reducing power consumption by reducing the lengths of signal interconnects, and improving yield and fabrication cost if individual dies are tested separately prior to assembly.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
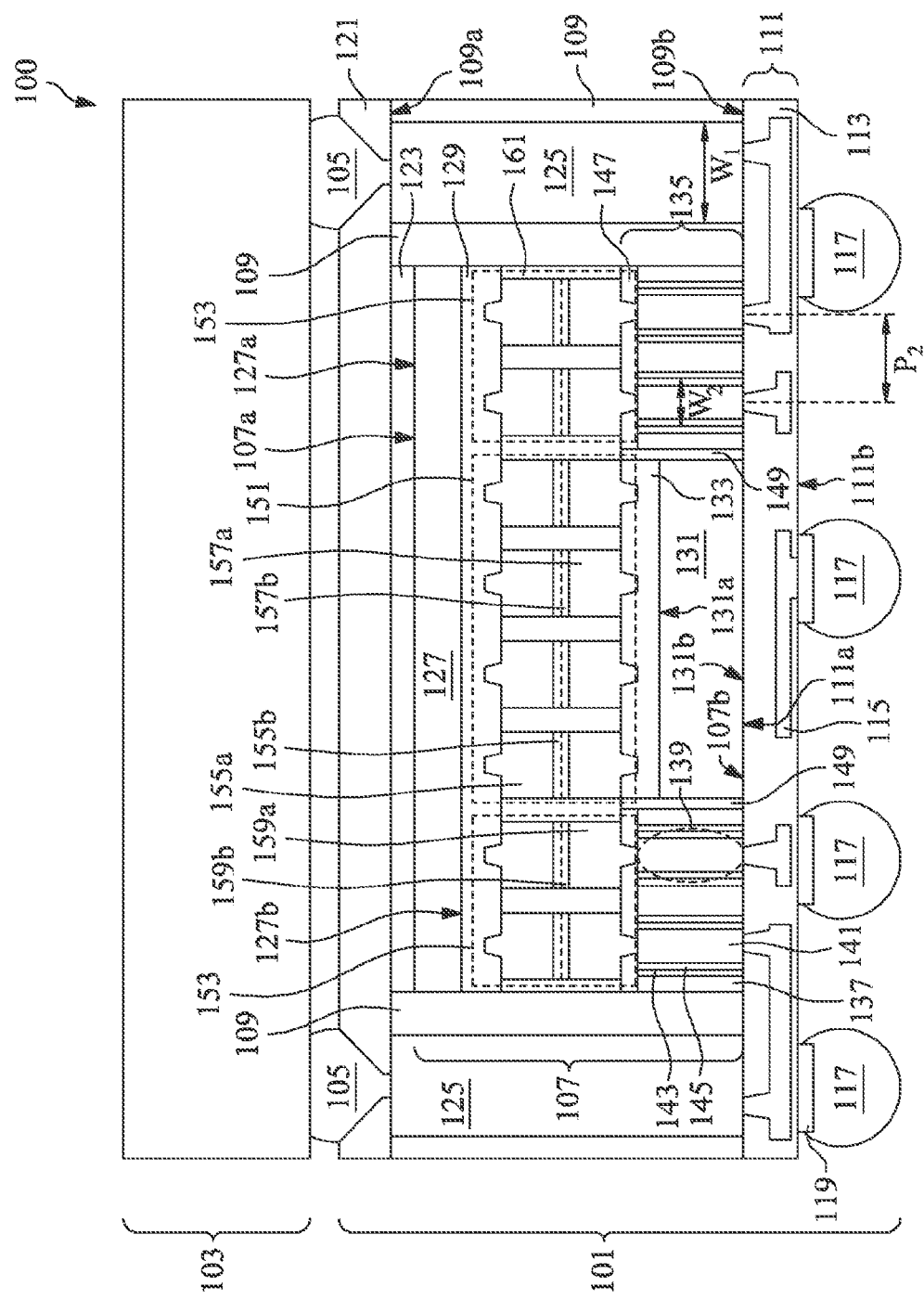
FIG. 1 illustrates a cross-sectional view of a stacked device in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments will be described with respect to embodiments in a specific context, namely a stacked device, such as a package-on-package (PoP) device, a chip-on-package (CoP) device, or the like. Various intermediate stages of forming a stacked device are illustrated. Some variations of the embodiments are discussed.

FIG. 1 illustrates a cross-sectional view of a stacked device 100 in accordance with some embodiments. The stacked device 100 comprises a first package 101 and a die structure 103 disposed over the package 101. In an embodiment wherein the stacked device 100 is a PoP device, the die structure 103 is a second package, or the like. In an embodiment wherein the stacked device 100 is a CoP device, the die structure 103 is a die, a stack of dies, or the like. The stacked device 100 further includes first connectors 105 disposed between the first package 101 and the die structure 103. The first connectors 105 electrically and mechanically couple or electrically and mechanically connect the first package 101 to the die structure 103. In the illustrated embodiment, two first connectors 105 are shown as an example; however, the number of first connectors 105 may be any number in accordance with some embodiments. In the embodiment shown in FIG. 1, the first connectors 105 have a spherical shape (e.g. balls). However, in other embodiments, the first connectors 105 may have variety of shapes such as pillars, posts, bumps, caps, or the like.

In some embodiments wherein the stacked device 100 is a PoP device, the first connectors 105 are ball grid array (BGA) balls. In other embodiments wherein the stacked device 100 is a CoP device, the first connectors 105 may include controlled collapse chip connection (C4) bumps and/or micro bumps. The first connectors 105 may comprise an electrically conductive material (e.g. a metal or a metal alloy). In some embodiments, the first connectors 105 may include a solder material. Suitable solder materials may be lead-based solders such as PbSn compositions, lead-free solders including InSb, tin, silver, and copper ("SAC") compositions, and other eutectic materials that have a common melting point and form conductive solder connections in electrical applications. For lead-free solder, SAC solders of varying compositions may be used, such as SAC 105 (Sn 98.5%, Ag 1.0%, Cu 0.5%), SAC 305, and SAC 405, as examples. Lead-free solders also include SnCu compounds, without the use of silver (Ag), and SnAg compounds, without the use of copper (Cu). In other embodiments, the first connectors 105 may be free of a solder material.

Referring further to FIG. 1, the first package 101 comprises a chip stack 107 disposed in a first encapsulant 109. The chip stack 107 has a first side 107a and a second side 107b opposite the first side 107a. The first side 107a of the chip stack 107 faces the die structure 103, and the second side 107b of the chip stack 107 faces away from the die structure 103. The first encapsulant 109 has a first side 109a and a second side 109b opposite the first side 109a. The first side 109a of the first encapsulant 109 faces the die structure 103, and the second side 109b of the first encapsulant 109 faces away from the die structure 103. In the illustrated embodiment, the second side 107b of the chip stack 107 is substantially coplanar with the second side 109b of the first encapsulant 109, and the first side 107a of the chip stack 107 is lower than the first side 109a of the first encapsulant 109. In some embodiments, the first encapsulant 109 may comprise a molding compound such as an epoxy, a resin, a moldable polymer, or the like. The molding compound may be filled with filler particles, such as silica filler, glass filler or similar fillers.

The first package 101 further comprises redistribution layers (RDLs) 111 formed on the second side 107b of the chip stack 107 and on the second side 109b of the first encapsulant 109. As described in greater detail below, the RDLs 111 comprise one or more first dielectric layers 113 and one or more first conductive features 115 disposed within the one or more first dielectric layers 113. In some embodiments, the one or more first dielectric layers 113 may comprise photo-patternable dielectric materials such as polyimide, benzocyclobutene (BCB), polybenzoxazole (PBO), the like, or a combination thereof. In other embodiments, the one or more first dielectric layers 113 may comprise non-photo-patternable dielectric materials such as silicon nitride, silicon carbide, silicon oxide, silicon oxynitride, low-k dielectrics such as carbon doped oxides, extremely low-k dielectrics such as porous carbon doped silicon dioxide, the like, or a combination thereof.

The one or more first conductive features 115 may comprise various lines/traces (running "horizontally" parallel to a major surface of the one or more first dielectric layers 113) and/or vias (extending "vertically" into the one or more first dielectric layers 113). In some embodiments, one or more first conductive features 115 comprise an electrically conductive material, such as copper, tungsten, aluminum, silver, gold, the like, or a combination thereof.

In the illustrated embodiment, a first side 111a of the RDLs 111 is in physical contact with the second side 107b of the chip stack 107 and the second side 109b of the first encapsulant 109. The second connectors 117 are formed over the second side 111b of the RDLs 111. The second connectors 117 may electrically and mechanically couple or electrically and mechanically connect the stacked device 100 to external systems such as a package substrate, a printed circuit board (PCB), a die, another package, or the like. In the illustrated embodiment, four second connectors 117 are shown as an example; however, the number of second connectors 117 may be any number in accordance with some embodiments. In the embodiment shown in FIG. 1, the second connectors 117 have a spherical shape (e.g. balls). However, in other embodiments, the second connectors 117 may have variety of shapes such as pillars, posts, bumps, caps, or the like. In the illustrated embodiment, the second connectors 117 are ball grid array (BGA) balls. In other embodiments, the second connectors 117 may include controlled collapse chip connection (C4) bumps and/or micro bumps. The second connectors 117 may be formed of similar materials as the first connectors 105.

In some embodiments, under bump metallizations (UBMs) 119 are formed between the RDLs 111 and the second connectors 117. The UBMs 119 may comprise one or more layers and may be formed of similar materials as the one or more first conductive features 115.

The first package 101 further comprises one or more second dielectric layers 121 formed on the first side 107a of the chip stack 107 and the first side 109a of the first encapsulant 109. The first connectors 105 are disposed in openings formed in the one or more second dielectric layers 121 as shown in FIG. 1. In some embodiments, the one or more second dielectric layers 121 may comprise similar materials as the one or more first dielectric layers 113. In some embodiments, an adhesive layer 123 is disposed between the first side 107a of chip stack 107 and the one or more second dielectric layers 121. The adhesive layer 123 may be a die attach film (DAF) or any suitable adhesive, epoxy, ultraviolet (UV) glue (which loses its adhesive property when exposed to UV radiation), or the like.

Referring further to FIG. 1, the first package 101 further comprises first through vias (TVs) 125, which are disposed in the first encapsulant 109 such that at least a portion of the first encapsulant 109 is interposed between sidewalls of the first TVs 125 and sidewalls of the chip stack 107. The first TVs 125 may also be referred to as through mold vias (TMVs) or through package vias (TPVs). In addition, the first TVs 125 physically contact the one or more first conductive features 115 of the RDLs 111 and corresponding first connectors 105 and provide electrical connection between the RDLs 111 and the first connectors 105. In other embodiments, other conductive components may be disposed between these various conductive features.

In the illustrated embodiment, the chip stack 107 is interposed between two first TVs 125. However, in other embodiments, more than two first TVs 125 are formed in the first encapsulant 109 such that the first TVs 125 surround the chip stack 107 as viewed from top. In addition, FIG. 1 shows a single first TV 125 disposed adjacent to and laterally apart from each sidewall of the chip stack 107. However, in other embodiments, more than one first TVs 125 may be formed adjacent to and laterally apart from each sidewall of the chip stack 107 according to a design specification of the first package 101. In some embodiments, the first TVs 125 have a first width $W_1$ between about 60 μm and about 400 μm, and a first pitch $P_1$ between about 100 μm and about 500 μm.

Referring further to FIG. 1, the chip stack 107 includes a first die 127. The first die 127 may be a die that has been singulated from a wafer including a plurality of dies. The first die 127 may be used in one or more applications. For example, in some embodiments, the first die 127 may be used in microelectromechanical systems (MEMS), logic, memory, power, analog or RF communications applications, although other applications may be possible as well in accordance with other embodiments. As an example, in a logic and memory application, the first die 127 may include a logic chip.

The first die 127 may comprise a substrate (such as a semiconductor substrate), various active and passive devices (such as transistors, capacitors, resistors, diodes, photodiodes, fuses and/or the like) on the substrate, various interconnect structures (e.g., one or more dielectric layers, such as interlayer dielectrics (ILDs) and/or intermetal dielectrics (IMDs), and one or more conductive features, such as metal lines and/or vias, disposed within the one or more dielectric layers) over the substrate, and contact pads (such as aluminum pads, or the like) over the interconnect structures, which are not explicitly illustrated in FIG. 1 as their inclusion is not necessary for understanding various embodiments described below. The first die 127 has a first side 127a and a second side 127b opposite the first side 127a. In the illustrated embodiment, the second side 127b of the first die 127 is an active side (a device side) of the first die 127. The first side 127a of the first die 127 coincides with the first side 107a of the chip stack 107. The first die 127 further comprises a first passivation layer 129 formed on the second side 127b of the first die 127. In some embodiments, the first passivation layer 129 may comprise dielectric materials such as silicon nitride, silicon carbide, silicon oxide, silicon oxynitride, the like, or a combination thereof.

The chip stack 107 further includes a second die 131, which is disposed below the first die 127. A width of the second die 131 is smaller than the a width of the first die 127 and at least a portion the first die 127 laterally extends beyond sidewalls of the second die 131. The second die 131 may be a die that may have been singulated from a wafer including a plurality of dies. The second die 131 may be used in one or more applications. For example, in an embodiment, the second die 131 may be used in microelectromechanical systems (MEMS), logic, memory, power, analog or RF communications applications, although other applications may be possible as well in accordance with other embodiments. As an example, in a logic and memory application, the second die 131 may include a logic chip, a memory chip or stacked memory chips, and the like. As an example, the second die 131 may include a random access memory chip and/or a wide input-output (I/O) memory chip. As a further example, the second die 131 may be an application-specific integrated circuit (ASIC).

The second die 131 has a first side 131a and a second side 131b opposite the first side 131a. The first side 131a of the second die 131 is an active side (a device side) of the second die 131, and the second side 131b of the second die 131 is substantially coplanar with the second side 107b of the chip stack 107 and the second side 109b of the first encapsulant 109. In some embodiments, the first side 131a of the second die 131 faces the second side 127b of the first die 127, as shown in FIG. 1. In an embodiment where the first side 131a of the second die 131 and the second side 127b of the first die 127 are active sides, the arrangement of the first die 127 and the second die 131 as shown in FIG. 1 may also be referred to as a face-to-face arrangement.

The second die 131 may comprise a substrate (such as a semiconductor substrate), various active and passive devices (such as transistors, capacitors, resistors, diodes, photodiodes, fuses and/or the like) on the substrate, various interconnect structures (e.g., one or more dielectric layers, such as interlayer dielectrics (ILDs) and/or intermetal dielectrics (IMDs), and one or more conductive features, such as metal lines and/or vias, disposed within the one or more dielectric layers) over the substrate, and contact pads (such as aluminum pads, or the like) over the interconnect structures, which are not explicitly illustrated in FIG. 1 as their inclusion is not necessary for understanding various embodiments described below. The second die 131 may further comprise second passivation layer 133 formed on the first side 131a of the second die 131. In some embodiments, the second passivation layer 133 may comprise similar material as the first passivation layer 129.

Referring further to FIG. 1, the chip stack 107 further includes through via (TV) chips 135 disposed below the first die 127 such that the second die 131 is interposed between the TV chips 135. In the embodiment of FIG. 1, two TV chips 135 are illustrated as an example; however, the number of TV chips 135 may be any number and may surround the second die 131 as viewed from top, in accordance with some embodiments. In other embodiments, two TV chips 135 shown in FIG. 1 are portions of a single annular-shaped TV chip and the second die 131 is disposed in a hole of the annular-shaped TV chip. The TV chips 135 are in electrical contact with the one or more first conductive features 115 of the RDLs 111.

Each of the TV chips 135 comprises a substrate 137. In some embodiments, the substrate 137 may be formed of silicon or glass, although it may also be formed of other group III, group IV, and/or group V elements, such as silicon, germanium, gallium, arsenic, and combinations thereof. In other embodiments, the substrate 137 may be a laminated substrate and may be formed of FR4, bis-maleimidetriazine (BT), or the like.

Each of the TV chips 135 further comprises second through vias (TVs) 139. The second TVs 139 may also be referred to as through substrate vias (TSVs). The second TVs 139 comprise an electrically conductive material 141. The electrically conductive material 141 may include similar material as the one or more first conductive features 115. In some embodiments, each of the second TVs 139 is electrically isolated from the substrate 137 by a liner layer 143, which surrounds each second TV 139. In some embodiments, the liner layer 143 comprises silicon oxide. However, in other embodiments, any suitable dielectric material may be also used to form the liner layer 143.

In some embodiments, each of the second TVs 139 further includes a barrier/adhesion layer 145 formed on sidewalls of the electrically conductive material 141 to protect the substrate 137 from diffusion. The barrier/adhesion layer 145 may comprise one or more layers of titanium, titanium nitride, tantalum, tantalum nitride, or other alternatives. The barrier/adhesion layer 145 is interposed between the electrically conductive material 141 and the liner layer 143. In some embodiments, the second TVs 139 have a second width $W_2$ between about 5 µm and about 60 µm, and a second pitch $P_2$ between about 10 µm and about 80 µm.

Each of the TV chips 135 further comprises a third passivation layer 147 disposed over the substrate 137 and the second TVs 139. In some embodiments, the third passivation layer 147 may comprise similar materials as the first passivation layer 129. In some embodiments, the TV chips 135 are free from active and/or passive devices. In other embodiments, the TV chips 135 may comprise variety of active and/or passive devices according to design specification of the chip stack 107.

The chip stack 107 further comprises a second encapsulant 149 disposed around the second die 131 and between the second die 131 and the TV chips 135. In some embodiments, the second encapsulant 149 may comprise similar materials as the first encapsulant 109.

Referring further to FIG. 1, first connector joints 151 are disposed between the first die 127 and the second die 131, and second connector joints 153 between the first die 127 and the TV chips 135. The first connector joints 151 electrically connect contact pads (not shown) of the first die 127 to contact pads (not shown) of the second die 131, and as a consequence electrically connect the first die 127 to the second die 131. The second connector joints 153 electrically connect the contact pads of the first die 127 to the second TVs 139 of the TV chips 135, and as a consequence electrically connect the first die 127 to the TV chips 135.

Each of the first connector joints 151 comprises one of third connectors 155a/155b in physical contact to one of fourth connectors 157a/157b. The third connectors 155a/155b are formed on the first passivation layer 129, extend though the first passivation layer 129, and are in electrical contact with the contact pads of the first die 127. The fourth connectors 157a/157b are formed on the second passivation layer 133, extend though the second passivation layer 133, and are in electrical contact with the contact pads of the second die 131. Each of the second connector joints 153 comprises one of the third connectors 155a/155b in physical contact to one of fifth connectors 159a/159b. The fifth connectors 159a/159b are formed on the TV chips 135, extend though the third passivation layer 147, and are in electrical contact with the second TVs 139.

In the illustrated embodiment, the third connectors 155, the fourth connectors 157, and the fifth connectors 159 comprise non-solder metal pillars 155a, 157a, and 159a (such as copper pillars) and solder caps 155b, 157b, and 159b over the non-solder metal pillars 155a, 157a, and 159a. As shown in FIG. 1, the solder caps 155b are in physical contact with the solder caps 157b and form single solder layers between the non-solder metal pillars 155a, and 157a. The solder caps 155b are in physical contact with the solder caps 159b and form single solder layers between the non-solder metal pillars 155a, and 159a. In other embodiments, the connectors may comprise only non-solder metal pillars.

The chip stack 107 further comprises an underfill layer 161 disposed between the first passivation layer 129 and the second passivation layer 133 and fills voids between individual ones of the first connector joints 151 and the second connector joints 153. The underfill layer 161 encapsulates the first connector joints 151 and the second connector joints 153 and protects the first connector joints 151 and the second connector joints 153 from moisture or contaminants.

Referring further to FIG. 1, in some embodiments, the die structure 103 may be a second package similar to the first package 101, and may comprise one or more dies (not shown). For example, in an embodiment, the one or more dies may be used in microelectromechanical systems (MEMS), logic, memory, analog, power or RF communications applications, although other applications may be possible as well in accordance with other embodiments. As an example, in a logic and memory application, the one or more dies may include a memory chip, examples of which include a dynamic random access memory chip, a wide I/O DRAM chip, a flash memory chip, a hybrid of (e.g. a combination of) a low power double data rate (LPDDR) chip and a flash memory chip, a LPDDR3/4 memory die, and the like. In an example of such an embodiment, the die structure 103 may be an LPDDR3/4 package, a wide I/O chip or a wide I/O chip package. As a further example, the one or more dies may be a die that can provide RF connectivity, e.g. to the underlying first package 101. In alternative embodiments, the die structure 103 may be a single die or a stack of dies.

Several advantages and effects are provided by the stacked device 100 shown in FIG. 1. For example, in an embodiment where the first die 127 is a logic die and where the second die 131 is an SRAM and/or wide I/O DRAM die, the arrangement shown in the first package 101 allows for face-to-face bonding of the first die 127 and the second die 131. Furthermore, in an embodiment where the die structure 103 is an LPDDR3/4 package, the TV chips 135 allow for communication (e.g. electrical communication) with the LPDDR3/4 package. Even further, the use of the TV chips 135 for fan-out purposes provides various advantages. For example, the TV chips 135 comprise TVs (such as, for example, the second TVs 139) having a width and a pitch that is smaller than those of TVs (such as, for example, the first TVs 125) formed directly in the first encapsulant 109, and thus, provide more I/O connections between the first die 127 and the RDLs 111.

FIGS. 2A-4H are cross-sectional views of various processing steps during fabrication of stacked devices such as the stacked device 100 in accordance with some embodiments. In particular, FIGS. 2A-2D are cross-sectional views of various processing steps during fabrication of the TV chips 135 in accordance with some embodiments. FIGS. 3A-3D are cross-sectional views of various processing steps during fabrication of chip stacks such as the chip stack 107 using the TV chips 135 in accordance with some embodiments. FIGS. 4A-4H are cross-sectional views of various processing steps during fabrication of stacked devices such as the stacked device 100 using the chip stacks 107 in accordance with some embodiments.

Figure 2A:
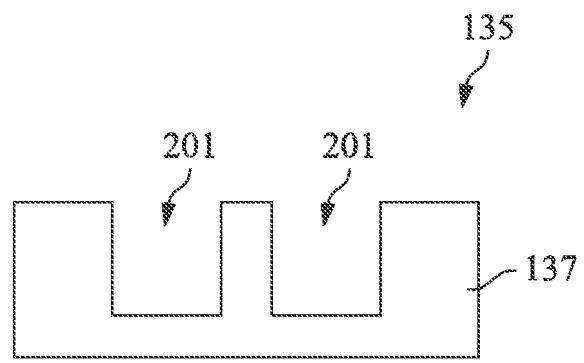
FIGS. 2A-2D are cross-sectional views of various processing steps during fabrication of through via (TV) chips in accordance with some embodiment.

Referring first to FIG. 2A, a portion of the substrate 137 is illustrated. The substrate 137 is patterned to form openings 201. As described below in greater detail, the openings 201 are subsequently filled with electrically conductive materials to form the second TVs 139 (see FIG. 1). In the illustrated embodiment, the TV chips 135 are formed at a wafer level. In such embodiments, the substrate 137 is a wafer, and a plurality of TV chips 135 are formed in the wafer and subsequently singulated into individual TV chips 135. FIG. 2A illustrates two openings 201 as an example. However, one skilled in the art will appreciate that the number or the openings 201 may be more than two and may vary according to a design specification for the TV chips 135.

In some embodiments, the substrate 137 may be patterned using photolithography techniques. Generally, photolithography techniques involve depositing a photoresist material, which is subsequently irradiated (exposed) and developed to remove a portion of the photoresist material. The remaining photoresist material protects the underlying material, such as the substrate 137, from subsequent processing steps, such as etching. A suitable etching process, such as an anisotropic dry etch such as a reactive ion etch (RIE), an isotropic or anisotropic wet etch, or any other suitable etch or patterning process may be applied to remove the exposed portions of the substrate 137.

Figure 2B:
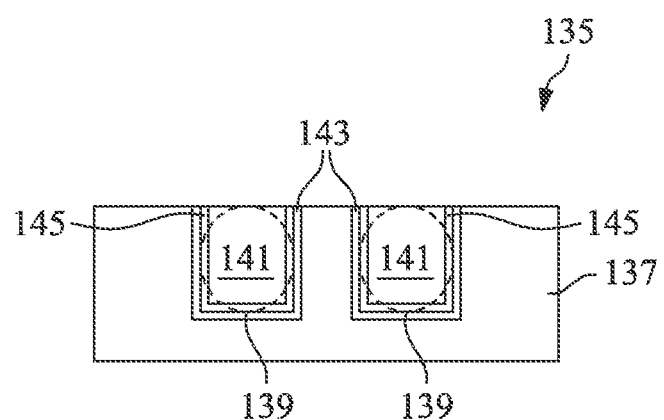

Referring to FIG. 2B, a liner layer 143 is conformally formed over the substrate 137 and in the openings 201. In some embodiments, the liner layer 143 may comprise a suitable dielectric material and may be formed using chemical vapor deposition (CVD), plasma enhanced CVD (PECVD), sub atmospheric CVD (SACVD), atomic layer deposition (ALD), the like, or combination thereof. The liner layer 143 is configured to electrically isolate subsequently formed TVs from the substrate 137.

In some embodiments, a barrier/adhesion layer 145 is conformally formed over the liner layer 143. The barrier/adhesion layer 145 may be formed using sputtering, physical vapor deposition (PVD), CVD, ALD, the like or a combination thereof. The barrier/adhesion layer 145 is configured to act a diffusion barrier and protect the substrate from metal diffusion.

Referring further to FIG. 2B, the second TVs 139 are formed by filling the openings 201 with an electrically conductive material 141. In some embodiment, the electrically conductive material 141 is deposited using an electrochemical plating process, an electroless plating process, ALD, PVD, the like, or a combination thereof. In some embodiments, before filling the openings 201 with the electrically conductive material 141, a thin seed layer (not shown) is conformally formed over the barrier/adhesion layer 145, and the electrically conductive material 141 is deposited over the thin seed layer. The thin seed layer may comprise copper, titanium, nickel, gold, manganese, the like, or a combination thereof, and may be formed by ALD, PVD, sputtering, the like, or a combination thereof.

In some embodiments, the openings 201 are over-filled with the electrically conductive material 141, which may be removed using an etch process, a planarization process (e.g., a chemical mechanical polishing (CMP) process), or the like, such that a topmost surface of the substrate 137 is exposed. In the illustrated embodiment, the topmost surface of the substrate 137 is substantially coplanar with topmost surfaces of the electrically conductive material 141, the barrier/adhesion layer 145, and the liner layer 143.

Figure 2C:
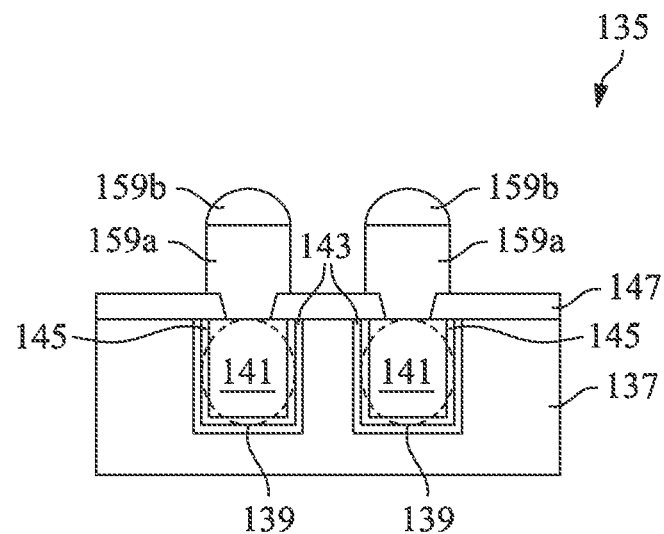

Referring to FIG. 2C, a third passivation layer 147 is formed over the substrate 137 and the second TVs 139. In some embodiments, the third passivation layer 147 may be formed using spin-on, CVD, PECVD, ALD, the like, or a combination thereof. The third passivation layer 147 is patterned to expose the underlying electrically conductive material 141. In some embodiments, the third passivation layer 147 may be patterned using similar methods as the substrate 137 and the description is not repeated herein.

Referring further to FIG. 2C, fifth connectors 159a/159b are formed on the TV chips 135. The fifth connectors 159a/159b are formed in contact with corresponding second TVs 139. In some embodiments, a thin seed layer (not shown) is conformally formed on the patterned third passivation layer 147 and on the exposed underlying electrically conductive material 141. The thin seed layer may comprise copper, titanium, nickel, gold, manganese, the like, or a combination thereof, and may be formed by ALD, PVD, sputtering, the like, or a combination thereof. In some embodiment, a sacrificial layer (not shown) such as, for example, a photoresist layer is formed on the thin seed layer and is patterned to form openings in the sacrificial layer. The openings expose portions of the thin seed layer formed on the electrically conductive material 141. A non-solder metallic material is deposited in the openings to form non-solder metal pillars 159a. Subsequently, a solder material is deposited over the non-solder metallic material to form solder caps 159b. In some embodiments, the non-solder metallic material and the solder material may be deposited using an electro-chemical plating process, an electroless plating process, the like, or a combination thereof. After forming the fifth connectors 159a/159b, the sacrificial layer is removed. In some embodiment, the sacrificial layer may be removed using, for example, an ash and/or stripping process when the sacrificial layer is formed of a photoresist material. Subsequently, exposed portions of the thin seed layer are removed using, for example, a suitable etch process, or the like.

In some embodiments, a solder reflow process may be performed to reflow the solder material of the solder caps 159b. In some embodiments, the formation of the fifth connectors 159a/159b may further include the formation of under bump metallizations (UBMs) (not shown) interposed between the fifth connectors 159a/159b and the second TVs 139. In some embodiments, the UBMs may comprise one or more layers of a suitable conductive material.

Figure 2D:
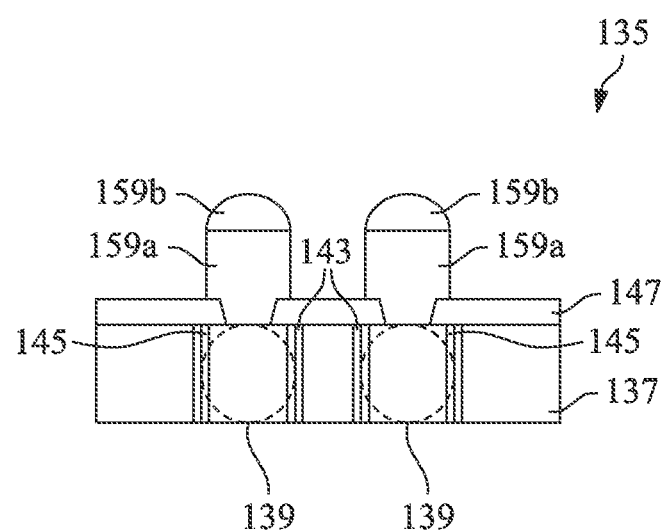

Referring to FIG. 2D, a back side of the substrate 137 is thinned such that bottommost surfaces of the second TVs 139 are exposed. In some embodiments, the back side of the substrate 137 may be thinned using, for example, a mechanical grinding process, a CMP process, an etch process, or the like. In the illustrated embodiment, the bottommost surfaces of the second TVs 139 are substantially coplanar with a bottommost surface of the substrate. Subsequently, the substrate 137 is singulated to form individual TV chips 135. In some embodiments, the substrate 137 may be singulated into the individual TV chips 135 by sawing, laser ablation, or the like.

Figure 3A:
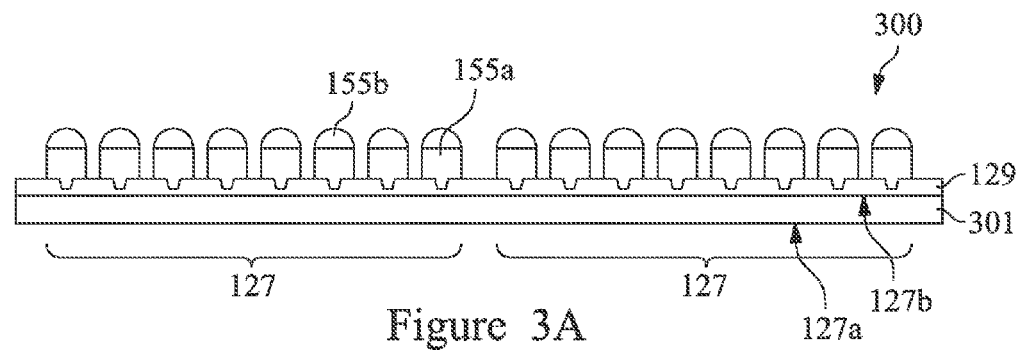
FIGS. 3A-3D are cross-sectional views of various processing steps during fabrication of chip stacks in accordance with some embodiments.

FIGS. 3A-3D are cross-sectional views of various processing steps during fabrication of a chip stack 107 (see FIG. 1) using the TV chips 135 in accordance with some embodiments. Referring first to FIG. 3A, a stacked structure 300 comprises a wafer 301. The wafer 301 comprises first dies 127 formed therein. The stacked structure 300 further comprises a first passivation layer 129 formed on a top side of the wafer 301. In the illustrated embodiment, the top side of the wafer 301 coincides with the second side 127b of the first dies 127. In some embodiments, the first passivation layer 129 may be formed using similar methods as the third passivation layer 147 and the description is not repeated herein.

Referring further to FIG. 3A, the third connectors 155a/155b are formed using similar methods as the fifth connectors 159a/159b and the description is not repeated herein. In some embodiments, a solder reflow process may be performed to reflow the solder material of the solder caps 155b. In some embodiments, the formation of the third connectors 155a/155b may further include the formation of under bump metallizations (UBMs) (not shown) interposed between the third connectors 155a/155b and the contact pads of the first die 127. In some embodiments, the UBMs may comprise one or more layers of a suitable conductive material.

Figure 3B:
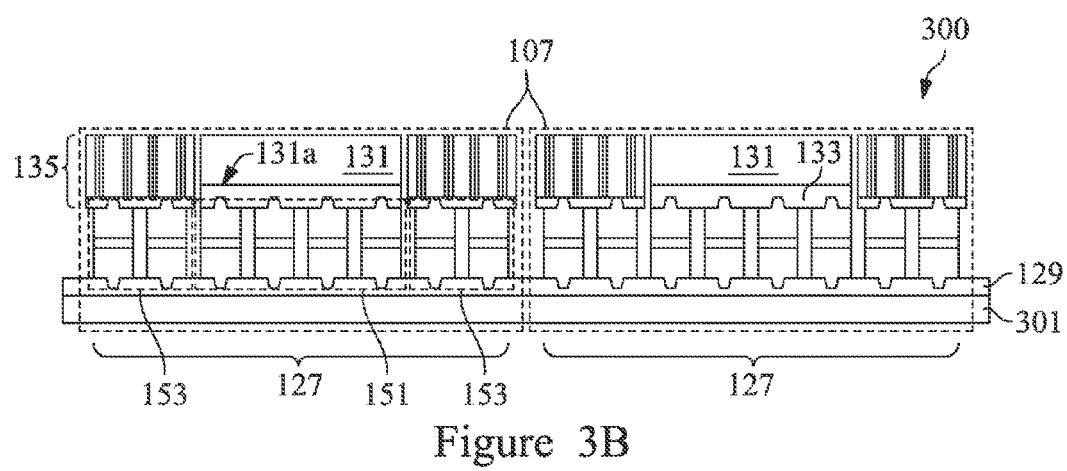

Referring to FIG. 3B, the second dies 131 and the TV chips 135 are flip-chip bonded to the first dies 127 to form chip stacks 107. Each of the second dies 131 comprises a second passivation layer 133 formed on the first side 131a of each of the second dies 131 and fourth connectors 157a/157b formed on the second passivation layer 133. The second passivation layer 133 may be formed using similar methods as the third passivation layer 147 and the description is not repeated herein. In some embodiments, the fourth connectors 157a/157b are formed using similar methods as the fifth connectors 159a/159b and the description is not repeated herein. In some embodiments, a solder reflow process may be performed to reflow the solder material of the solder caps 157b. In some embodiments, the formation of the fourth connectors 157a/157b may further include the formation of under bump metallizations (UBMs) (not shown) interposed between the fourth connectors 157a/157b and the contact pads of the second die 131. In some embodiments, the UBMs may comprise one or more layers of a suitable conductive material.

In some embodiments, a reflow process is performed to melt solder caps 155b, 157b, and 159b and form first connector joints 151 and second connector joints 153. The reflow process fuses the solder caps 155b and 157b, and the solder caps 155b and 159b to form single solder layers. The first connector joints 151 mechanically and electrically connect the first dies 127 to the second dies 131, and the second connector joints 153 mechanically and electrically connect the first dies 127 to the TV chips 135.

Figure 3C:
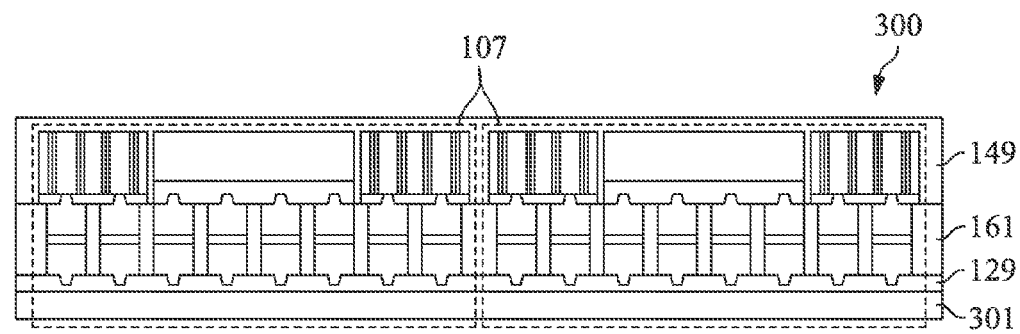

Referring to FIG. 3C, an underfill layer 161 is formed between the first dies 127 and the second dies 131, between the first dies 127 and the TV chips 135, and in the voids between individual first connector joints 151 and the second connector joints 153. In some embodiments, an underfill material is dispensed and cured to form the underfill layer 161. Subsequently, a second encapsulant 149 is formed over the first dies 127, the second dies 131, and the TV chips 135, and around the second dies 131 and the TV chips 135. The second encapsulant 149 may be formed by applying a molding compound, such as epoxy or resin, while substantially liquid and then curing through a chemical reaction. In other embodiments, the molding compound may be an ultraviolet (UV) or thermally cured polymer applied as a gel or malleable solid capable of being disposed around the second dies 131 and the TV chips 135. In yet other embodiments, the molding compound may be pressure molded using a mold (not shown) to force the molding compound into openings and voids, eliminating air pockets or the like in the molding compound.

Referring further to FIG. 3C, in some embodiments, a top side of the second encapsulant 149 may be thinned using, for example, a mechanical grinding process, a CMP process, and etch process, or the like. In the illustrated embodiment, at least a portion of the second encapsulant 149 remains over the second die 131 and TV chips 135 to protect the stacked structure 300 from further processing steps. In some embodiments, a back side of the wafer 301 is thinned. The back side of the wafer 301 may be thinned using, for example, a mechanical grinding process, a CMP process, and etch process, or the like.

Figure 3D:
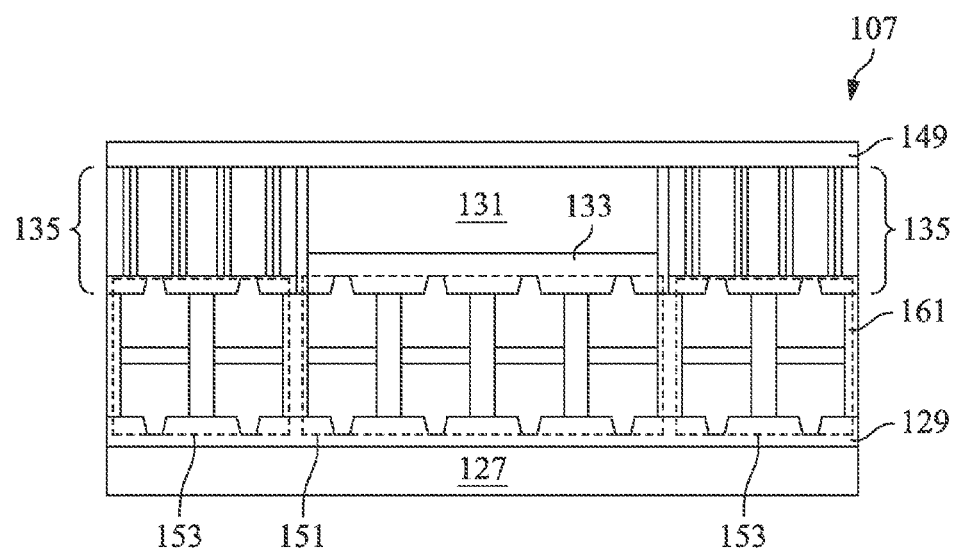

Subsequently, the stacked structure 300 is singulated to form individual chip stacks 107 such as the chip stack 107 illustrated in FIG. 3D. In some embodiments, the stacked structure 300 may be singulated into the individual chip stacks 107 by sawing, laser ablation, or the like. In the illustrated embodiment, the chip stack 107 comprises two dies (such as the first die 127 and the second die 131). However, in other embodiments, the chip stack 107 may comprise more than two dies. In yet other embodiments, the chip stack 107 may comprise more than one of the first dies 127 and more than one of the second dies 131.

Figure 4A:
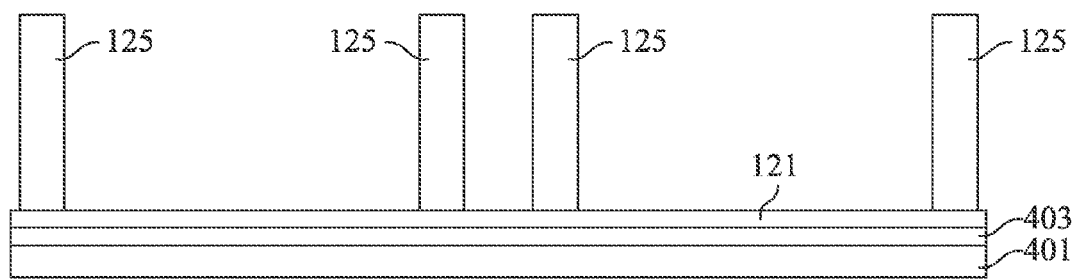
FIGS. 4A-4H are cross-sectional views of various processing steps during fabrication of stacked devices in accordance with some embodiments.

FIGS. 4A-4H are cross-sectional views of various processing steps during fabrication of stacked devices such as the stacked device 100 using the chip stacks 107 in accordance with some embodiments. Referring first to FIG. 4A, one or more second dielectric layers 121 are formed over a carrier 401. The carrier 401 may be formed of quartz, glass, or the like, and provides mechanical support for subsequent operations. The one or more second dielectric layers 121 may be formed using spin-on coating, CVD, PECVD, ALD, the like, or combination thereof. In some embodiments, a release layer 403 may be formed on the carrier 401. The release layer 403 is subsequently used to debond the carrier 401 from the stacked device 100 after all the packaging processes are completed. In some embodiments, the release layer 403 may comprise a light to heat conversion (LTHC) material, a UV adhesive, or the like. The release layer 403 may be formed using a deposition process, a spin coating, a printing process, a lamination process, or the like. In some embodiments, the release layer 403 is formed of a LTHC material that, when exposed to light, partially or fully loses its adhesive strength and the carrier 401 can be easily removed from the back side of the stacked devices 100.

Referring further to FIG. 4A, first TVs 125 are formed on the one or more second dielectric layers 121. In some embodiments, a thin seed layer (not shown) is formed on the one or more second dielectric layers 121. The thin seed layer may comprise copper, titanium, nickel, gold, manganese, the like, or a combination thereof, and may be formed by ALD, PVD, the like, or a combination thereof. In some embodiments, a sacrificial layer (not shown) is formed on the thin seed layer. The sacrificial layer may comprise, for example, a photoresist material, or any suitable material that is configured to be removed after the first TVs 125 are formed. The sacrificial layer is subsequently patterned to form openings in the sacrificial layer. The openings in the sacrificial layer are filled with a suitable electrically conductive material using, for example an electro-chemical plating process, an electroless plating process, the like, or a combination thereof. Subsequently, the sacrificial layer is removed using any suitable removal process. For example, the sacrificial layer formed of a photoresist material may be removed using an ashing process followed by a wet clean process. Subsequently, exposed portions of the thin seed layer are removed using, for example, a suitable etch process, or the like.

Figure 4B:
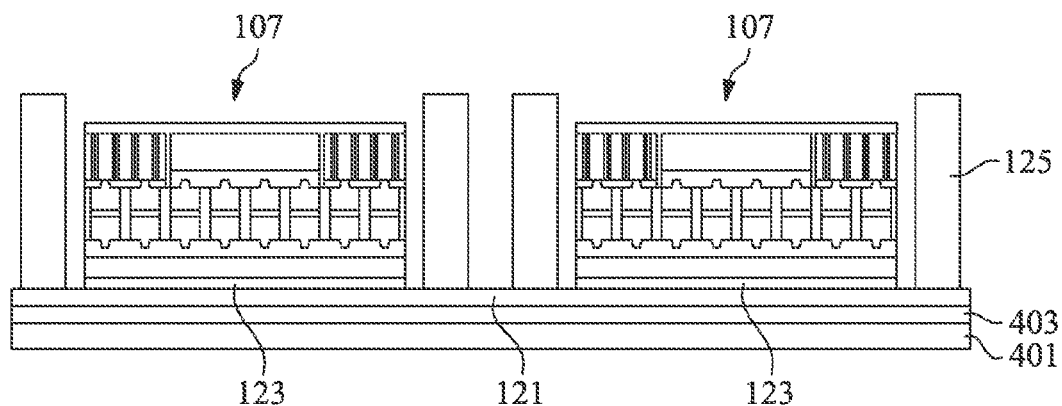

Referring to FIG. 4B, the chip stacks 107 are attached to the one or more second dielectric layers 121 using adhesive layers 123 formed on the first sides 107a of the chip stacks 107. In some embodiments, the adhesive layer 123 and may be formed using a spin coating process, a printing process, a lamination process, or the like.

Figure 4C:
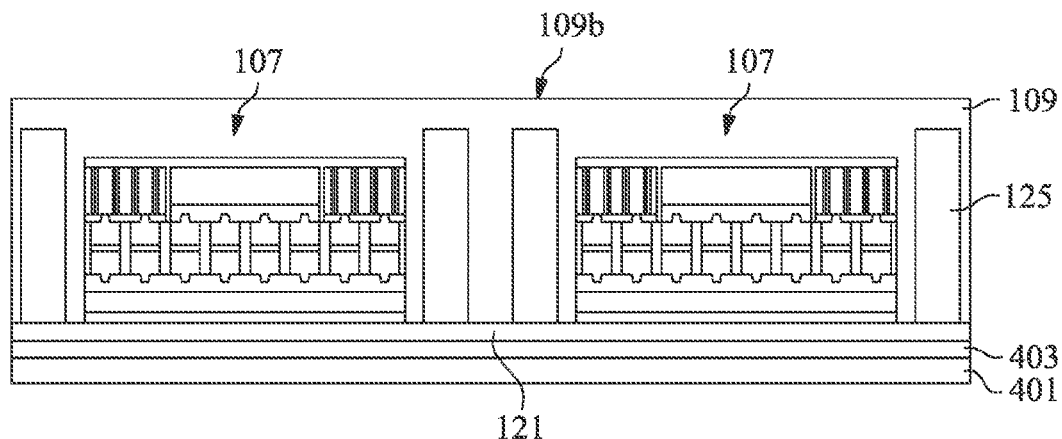

Referring to FIG. 4C, the first encapsulant 109 is formed over the one or more second dielectric layers 121, the first TVs 125, and the chip stacks 107. In the illustrated embodiment, the first encapsulant 109 surrounds each of the chip stacks 107 and each of the first TVs 125. In some embodiments, the first encapsulant 109 may be formed using similar methods as the second encapsulant 149 and the description is not repeated herein.

Figure 4D:
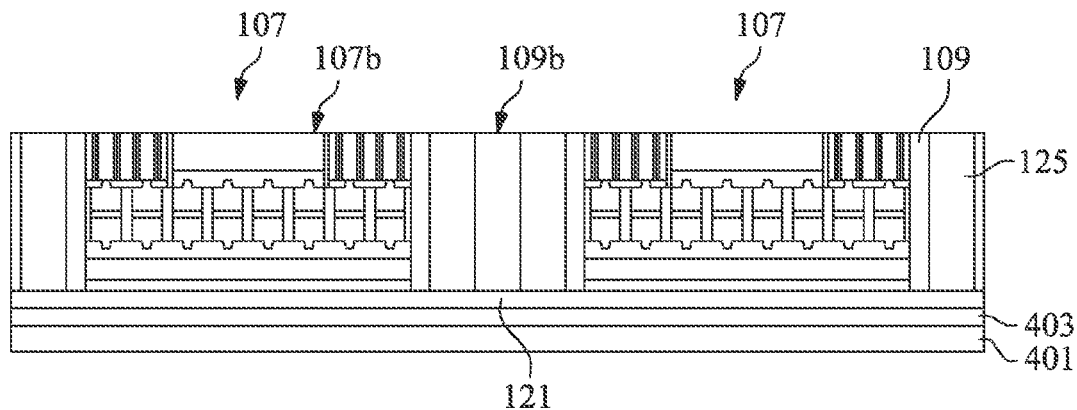

Referring to FIG. 4D, in some embodiments, the first encapsulant 109, the chip stacks 107 and the first TVs 125 are planarized such that top sides of the first TVs 125, the second side 109b of the first encapsulant 109, and the second sides 107b of the chip stacks 107 are substantially coplanar. The planarization process may include a mechanical grinding process, a CMP process, an etch process, or the like.

Figure 4E:
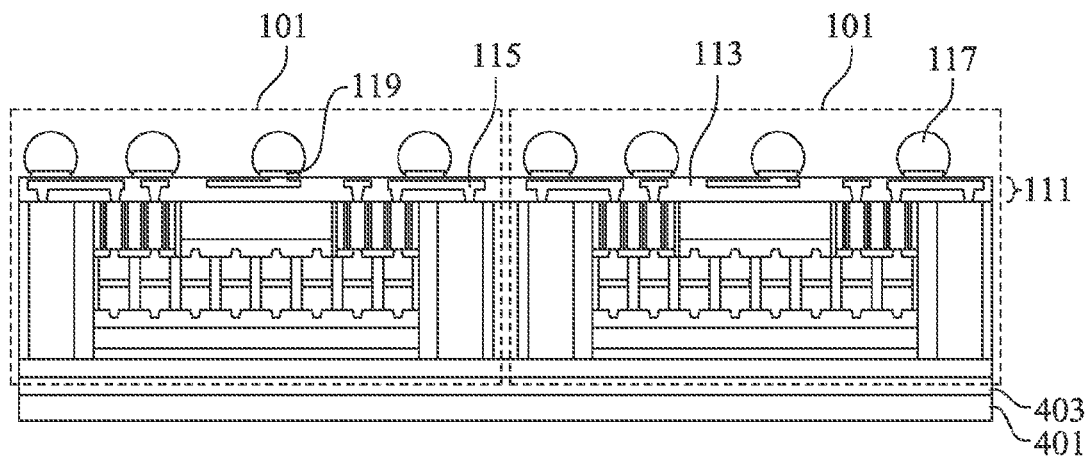

Referring to FIG. 4E, the RDLs 111 are formed on the second sides 109b of the second side 109b of the first encapsulant 109, the second sides 107b of the chip stacks 107, and on the top sides of the first TVs 125. The RDLs 111 comprises one or more first dielectric layers 113 and one or more first conductive features 115 disposed within the one or more first dielectric layers 113. In some embodiments, the one or more first dielectric layers 113 are formed using similar methods as the one or more second dielectric layers 121 and the description is not repeated herein. In some embodiments, each of the one or more first dielectric layers 113 may be patterned to expose underlying conductive features. For example, a bottommost dielectric layer (not individually illustrated) of the one or more first dielectric layers 113 is patterned to expose the first TVs 125 and the second TVs 139. In some embodiment, the one or more first dielectric layers 113 comprising a photo-patternable material may be patterned using an acceptable photolithography technique. For example, the bottommost dielectric layer of the one or more first dielectric layers 113 is exposed to light and subsequently developed and/or cured. In some embodiments, a seed layer (not shown) is deposited over the patterned bottommost dielectric layer. The seed layer may comprise copper, titanium, nickel, gold, manganese, the like, or a combination thereof, and may be formed by ALD, PVD, the like, or a combination thereof. Subsequently, a photoresist material (not shown) is deposited over the seed layer and patterned to define the desired pattern for the first conductive feature a first conductive feature (not individually shown) of the one or more first conductive features 115. A conductive material, such as copper, tungsten, aluminum, silver, gold, the like, or a combination thereof, and is formed on the seed layer by an electro-chemical plating process, an electroless plating process, ALD, PVD, the like, or a combination thereof. The first conductive feature may comprise various lines/traces (running "horizontally" across a top surface of the bottommost dielectric layer) and/or vias (extending "vertically" through the bottommost dielectric layer, and contacting the first TVs 125 and the second TVs 139). The photoresist material is removed using appropriate photoresist stripping process, such as ashing followed by a wet clean process. Subsequently, exposed portions of the seed layer over the bottommost dielectric layer are removed using, for example, a wet or dry etch. The process described above is applied to other dielectric layers of the one or more first dielectric layers 113 until formation of the RDLs 111 is completed.

Referring further to FIG. 4E, second connectors 117 are formed on the RDLs 111. In some embodiments wherein the stacked device is a PoP device, the second connectors 117 comprise BGA balls and may be formed using, for example, a suitable ball drop process. In other embodiments wherein the stacked device is a CoP device, the second connectors 117 comprise C4 bumps and may be formed using, for example, a suitable ball drop process. In some embodiments, wherein the second connectors 117 comprise a solder material, a solder reflow process may be performed to reflow the solder material of the second connectors 117. In some embodiments, UBMs 119 are formed between the RDLs 111 and the second connectors 117. The UBMs 119 may be formed using suitable deposition and patterning processes. In the illustrated embodiment, the semiconductor structure of FIG. 4E comprises a plurality packages such the first packages 101.

Figure 4F:
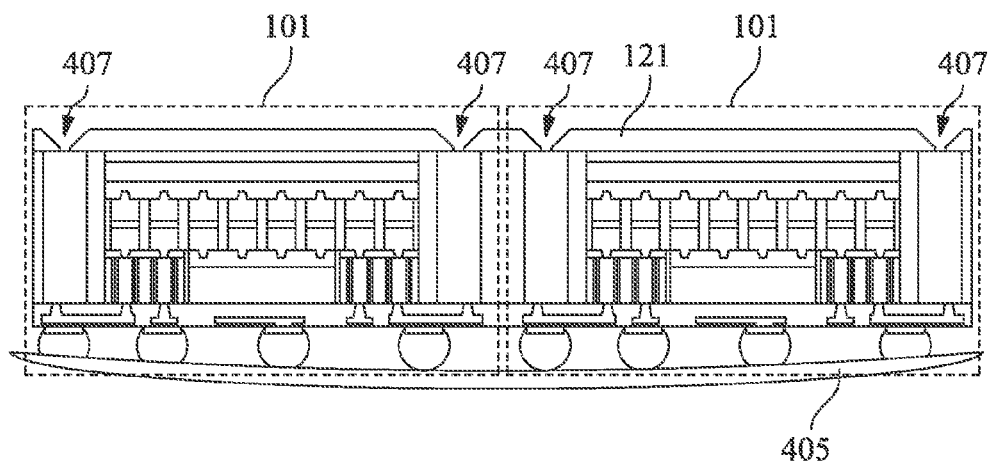

Referring to FIG. 4F, the carrier 401 is removed from the semiconductor structure of FIG. 4E. In some embodiments, the release layer 403 formed of a LTHC material is exposed to light, and the carrier 401 is safely removed from the semiconductor structure of FIG. 4E. Subsequently, the semiconductor structure of FIG. 4E is placed on a dicing tape 405 for further processing. In other embodiments, the semiconductor structure of FIG. 4E may be placed on any suitable support depending on process steps preformed on the semiconductor structure of FIG. 4E.

Referring to FIG. 4F, openings 407 are formed in the one or more second dielectric layers 121. In the illustrated embodiments, the openings expose the first TVs 125. In some embodiments, the openings 407 are formed using, for example, a suitable etch process, a laser drilling process, or the like. In the illustrated embodiment, the one or more second dielectric layers 121 are formed before debonding the semiconductor structure of FIG. 4E from the carrier 401. In other embodiments, the one or more second dielectric layers 121 are formed after debonding the semiconductor structure of FIG. 4E from the carrier 401. In such embodiments, the one or more second dielectric layers 121 comprising a photo-patternable material may be patterned using an acceptable photolithography technique. For example, the one or more second dielectric layers 121 are exposed to light and subsequently developed and/or cured to form the openings 407.

Figure 4G:
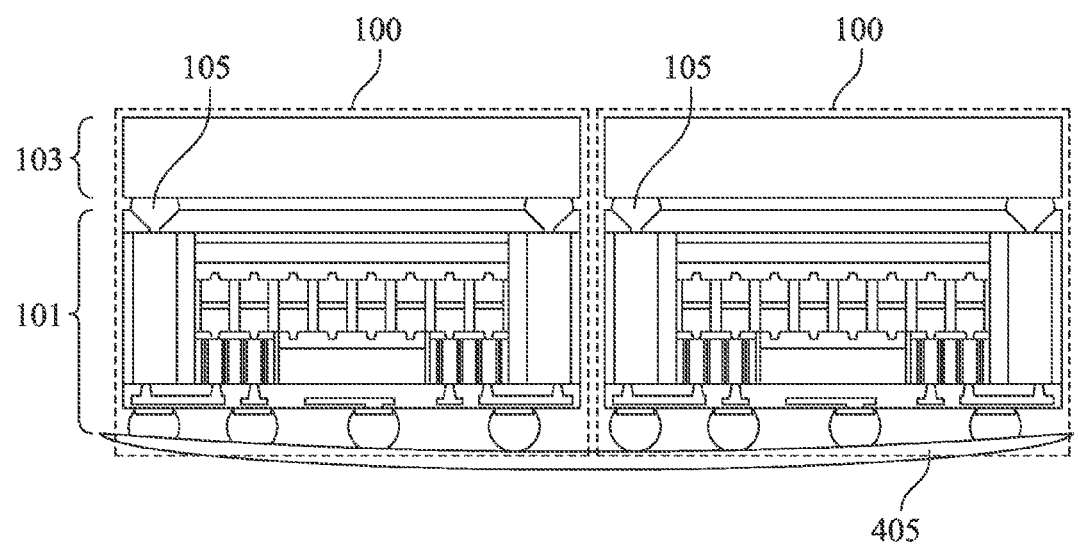

Referring to FIG. 4G, the die structures 103 are bonded to the semiconductor structure of FIG. 4F using the first connectors 105. In the illustrated embodiment, each of die structures 103 is placed over the corresponding first package 101 to form stacked devices 100. In some embodiments, the first connectors 105 are formed in the openings 407 before the die structure 103 are bonded to the respective first packages 101. In the embodiments, the first connectors 105 are pre-formed on the die structure 103 before bonding the die structure 103 are bonded to the respective first packages 101. In the illustrated embodiment, the first connectors 105 comprise BGA balls and may be formed using, for example, a suitable ball drop process. In some embodiments, wherein the first connectors 105 comprise a solder material, a solder reflow process may be performed to reflow the solder material of the first connectors 105. In some embodiments, UBMs (not shown) may be formed between the first TVs 125 and the second connectors 117. The UBMs may be formed using suitable deposition and patterning processes.

Figure 4H:
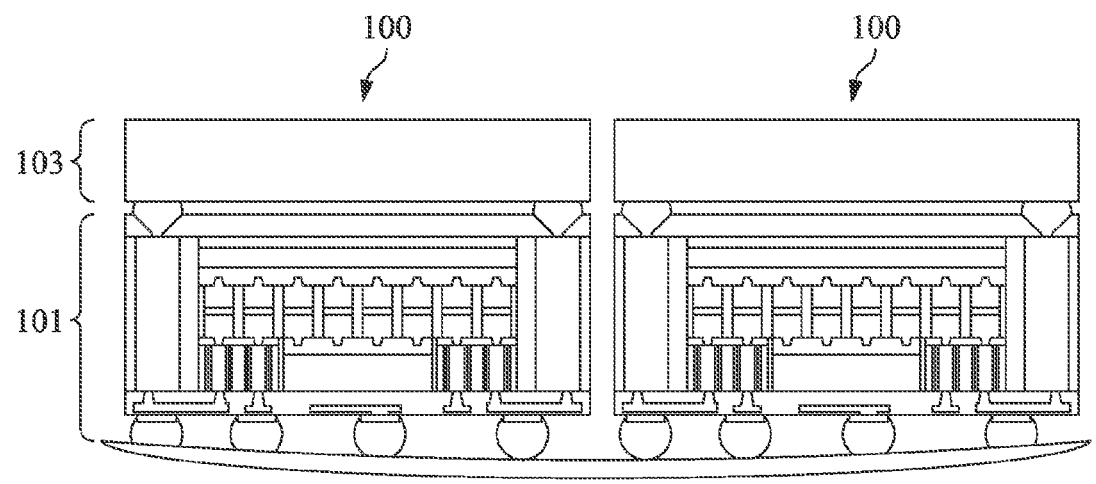

Referring to FIG. 4H, the semiconductor structure of FIG. 4G is singulated to form individual stacked devices 100. In some embodiments, the semiconductor structure of FIG. 4G may be singulated into the individual stacked devices 100 by sawing, laser ablation, or the like. Subsequently, the stacked devices 100 are removed from the dicing tape 405 for further processing.

Figure 5:
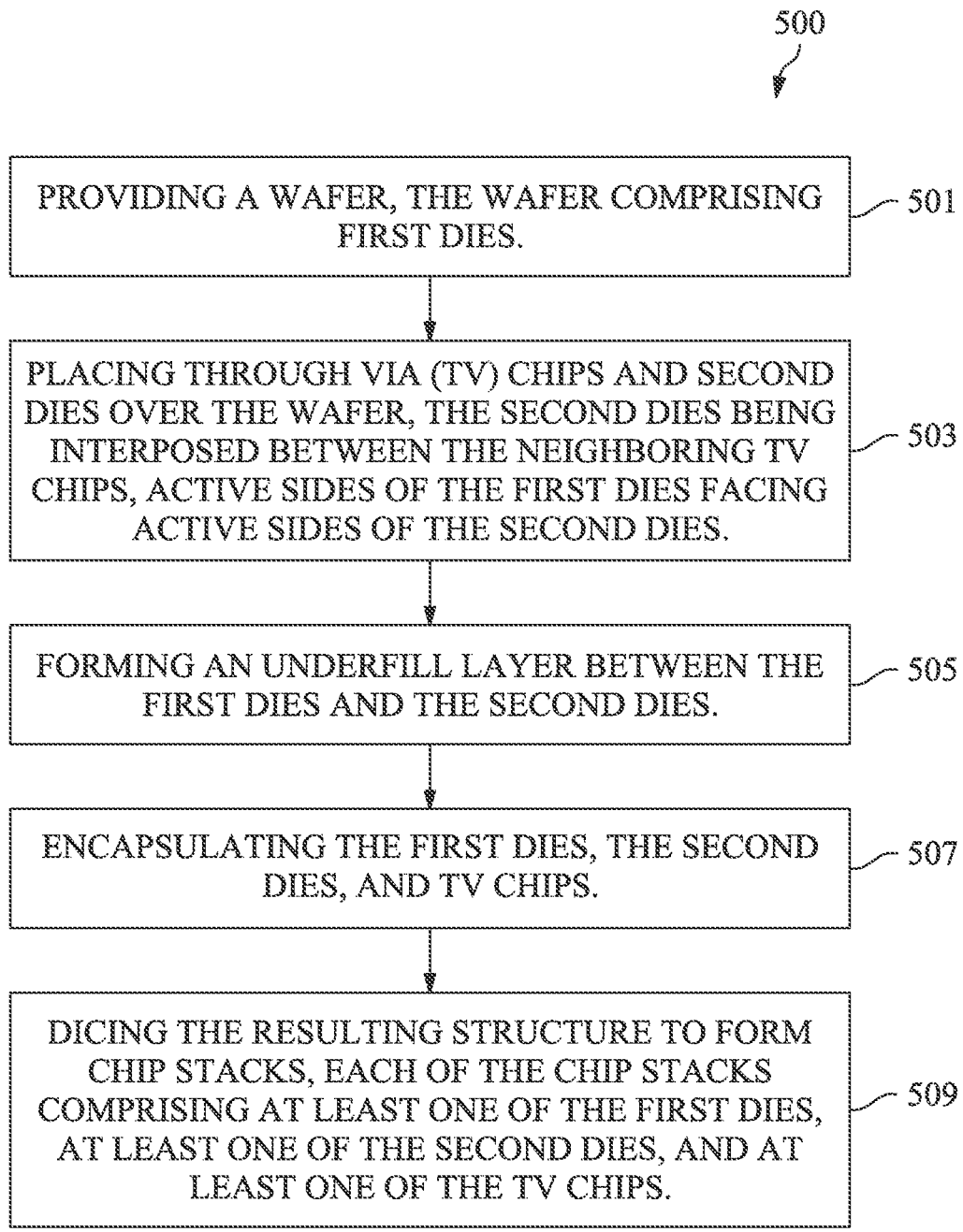
FIG. 5 is a flow diagram illustrating a method of forming chip stacks in accordance with some embodiments.

FIG. 5 is a flow diagram illustrating a method 500 of forming chip stacks in accordance with some embodiments. The method starts at step 501, wherein a wafer (such as the wafer 301) is provided, the wafer comprising first dies (such as the first dies 127) as described above with reference to FIG. 3A. In step 503, through via (TV) chips (such as the TV chips 135) and second dies (such as the second dies 131) are bonded to the wafer such that active sides of the first dies face active sides of the second dies as described above with reference to FIG. 3B. Moreover, each of the second dies is interposed between the neighboring TV chips. In step 505, an underfill layer (the underfill layer 161) is formed between the first dies and the second dies, and between the first dies and the TV chips as described above with reference to FIG. 3C. Subsequently, in step 507, an encapsulant (such as the second encapsulant 149) is formed over the second dies and the TV chips, the encapsulant surrounding each of the second dies and each of the TV chips as described above with reference to FIG. 3C. In step 509, the resulting structure is diced to form chip stacks (such as the chip stack 107) as described above with reference to FIG. 3D. In some embodiments, each of the chip stacks comprises at least one of the first dies, at least one of the second dies, and at least one of the TV chips.

Figure 6:
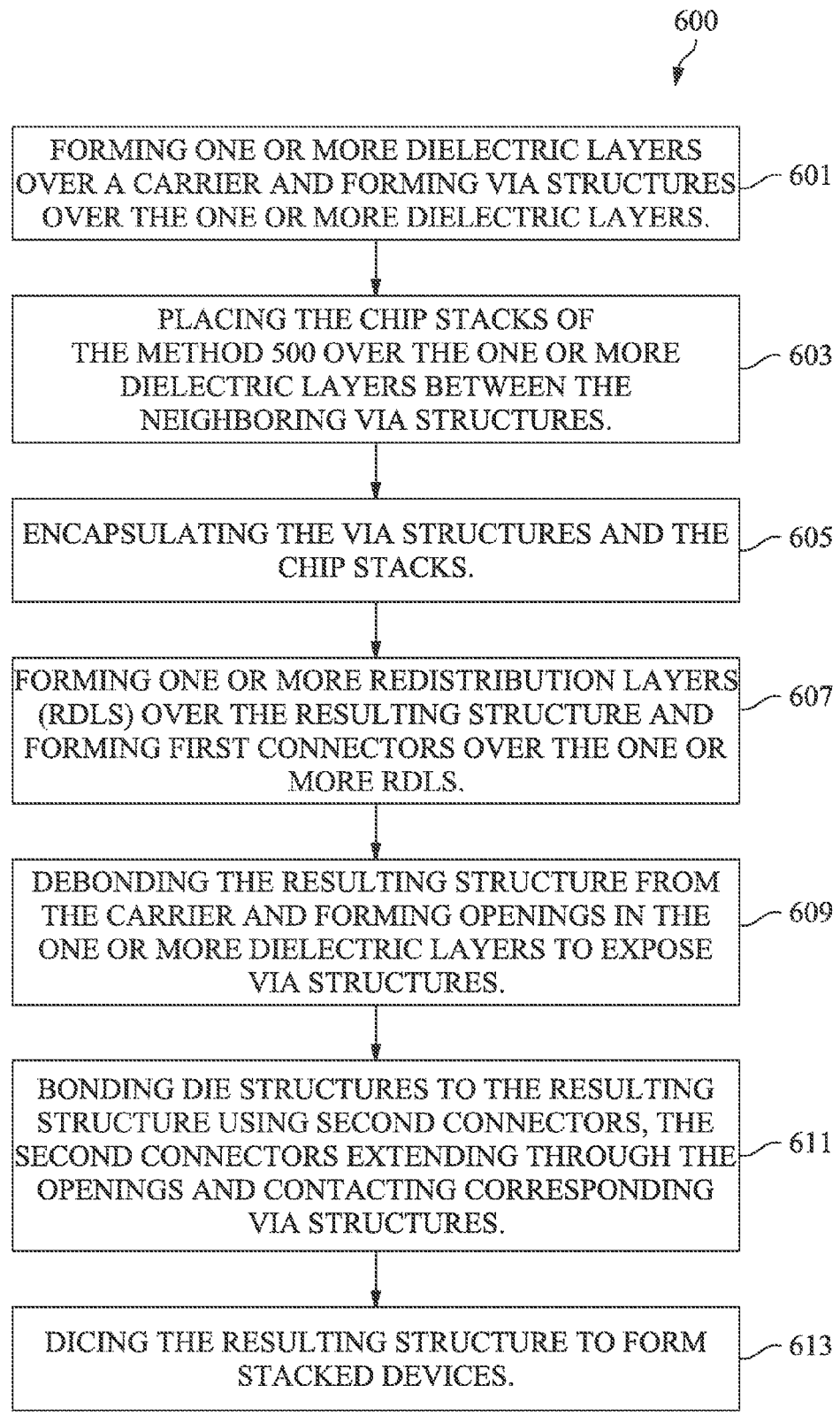
FIG. 6 is a flow diagram illustrating a method of forming stacked devices in accordance with some embodiments.

FIG. 6 is a flow diagram illustrating a method 600 of forming the stacked devices (such as the stacked device 100) using the chips stacks formed by the method 500 in accordance with some embodiments. In some embodiments, the method starts at step 601, wherein one or more dielectric layers (such as the one or more second dielectric layers 121) are formed over a carrier (such as the carrier 401) as described above with reference to FIG. 4A. In alternative embodiments, one or more dielectric layers are not formed at step 601, but at a later step. Subsequently, via structures (such as the first TVs 125) are formed over the one or more dielectric layers as described above with reference to FIG. 4A. In step 603, chip stacks (such as the chip stacks formed using the method 500) attached to the one or more dielectric layer between the neighboring via structures as described above with reference to FIG. 4B. In step 605, an encapsulant (such as the first encapsulant 109) is formed to encapsulate the via structures and the chips stacks as described above with reference to FIGS. 4C and 4D. In step 607, one or more redistribution layers (such as the RDLs 111) are formed over the encapsulated via structures and the chip stacks. Subsequently, first connectors (such as the second connectors 117) are formed over the one or more RDLs as described above with reference to FIG. 4E. In Step 609, the resulting structure is debonded from the carrier and the openings (such as the openings 407) are formed in the one or more dielectric layers as described above with reference to FIG. 4F. In embodiments wherein the one or more dielectric layers are not formed at step 601, step 609 further includes formation of the one or more dielectric layers in addition to forming the openings (such as the openings 407) in the one or more dielectric layers. In step 611, die structures (such as the die structures 103) are bonded to the resulting structure using second connectors (such as the first connectors 105), wherein the second connectors extent through the openings in the one or more dielectric layers and contact the corresponding via structures as described above with reference to FIG. 4G. In step 613, the resulting structure is diced to form stacked devices (such as the stacked device 100) as described above with reference to FIG. 4H. In some embodiments, each of the stacked devices comprises one of the die structures (such as the die structure 103) and one of the first packages (such as the first package 101), wherein the first package comprises one of the chip stacks.

According to an embodiment, a semiconductor device comprises a package. The package comprises a first encapsulant, a first via structure within the first encapsulant, the first via structure extending between a first side of the first encapsulant and a second side of the first encapsulant, the first side of the first encapsulant being opposite the second side of the first encapsulant, and a first die within the first encapsulant, at least a portion of the first encapsulant being interposed between a sidewall of the first die and a sidewall of the first via structure. The package further comprises a second die within the first encapsulant, an active side of the second die facing an active side of the first die, and a first via chip within the first encapsulant, the first via chip comprising one or more through vias, wherein the first via chip is disposed facing the active side of the first die, and between the second die and the first via structure.

According to another embodiment, a semiconductor device comprises a package bonded to a die structure. The package comprises a molding compound, the molding compound having a first side and a second side opposite the first side, a first via structure within the molding compound, the first via structure extending between the first side of the molding compound and the second side of the molding compound, and a first die within the molding compound, the first die being disposed at the first side of the molding compound, wherein a first sidewall of the first die is spaced apart from a sidewall of the first via structure. The package further comprises a second die within the molding compound, the second die being disposed at the second side of the molding compound, wherein an active side of the second die faces an active side of the first die, and a first via chip within the molding compound, the first via chip being disposed at the second side of the molding compound, the first via chip comprising one or more through vias, wherein a sidewall of the first via chip is spaced apart from a first sidewall of the second die.

According to yet another embodiment, a method of forming a semiconductor device, the method comprises forming a plurality of via structures on a carrier, and placing a chip stack on the carrier, the chip stack being disposed between a first via structure of the plurality of via structures and a second via structure of the plurality of via structures. The chip stacks comprises: a first die, a second die bonded to the first die, an active side of the first die facing an active side of the second die, and a via chip bonded to the first die, the via chip being disposed on a same side of the first die as the second die. The method further comprises bonding a die structure to the chip stack, the die structure facing a first side of the chip stack.

According to yet another embodiment, a method includes forming a chip stack. Forming the chip stack includes bonding a second die to a first die. An active side of the first die faces an active side of the second die. A via chip is bonded to the first die. The via chip is disposed on a same side of the first die as the second die. A plurality of via structures is formed on a carrier. The chip stack is placed on the carrier. The chip stack is disposed between a first via structure of the plurality of via structures and a second via structure of the plurality of via structures. A die structure is bonded to the chip stack. The die structure faces a first side of the chip stack. The first side of the chip stack and the active side of the first die face in opposite directions.

According to yet another embodiment, a method includes forming a chip stack. Forming the chip stack includes attaching a second die to a first die. A first side of the first die faces a first side of the second die. A second side of the first die and a second side of the second die face in opposite directions. The first side of the first die is opposite the second side of the first die. The first side of the second die is opposite the second side of the second die. A via chip is attached to the first die. A first side of the via chip faces the first side of the first die. A second side of the via chip and the second side of the second die face in a same direction. The first die, the second die, and the via chip are encapsulated using a first encapsulant. At least a portion of the first encapsulant is interposed between a third side of the second die and a third side of the via chip. The third side of the second die faces the third side of the via chip. The third side of the second die extends between the first side of the second die and the second side of the second die. The third side of the via chip extends between the first side of the via chip and the second side of the via chip. A first conductive pillar is formed on a carrier. The chip stack is attached to the carrier. The second side of the via chip faces the carrier. The chip stack is disposed adjacent the first conductive pillar. The chip stack and the first conductive pillar are encapsulated using a second encapsulant. At least a portion of the second encapsulant is interposed between a first side of the first conductive pillar and a fourth side of the via chip. The first side of the first conductive pillar faces the fourth side of the via chip. The fourth side of the via chip is opposite the third side of the via chip.

According to yet another embodiment, a method includes forming a chip stack. Forming the chip stack includes bonding a second die to a first die using a plurality of first connector joints. A first via chip is bonded to the first die using a plurality of second connector joints. A second via chip is bonded to the first die using a plurality of third connector joints. The plurality of first connector joints, the plurality of second connector joints, and the plurality of third connector joints are disposed on a same side of the first die. The plurality of first connector joints are interposed between the plurality of second connector joints and the plurality of third connector joints. A first gap between the second die and the first via chip and a second gap between the second die and the second via chip are filled with a first molding compound. A first conductive pillar and a second conductive pillar are formed on a carrier. The chip stack is bonded to the carrier. The chip stack is interposed between the first conductive pillar and the second conductive pillar. A third gap between the chip stack and the first conductive pillar and a fourth gap between the chip stack and the second conductive pillar are filled with a second molding compound.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
    forming a chip stack, wherein forming the chip stack comprises:
        bonding a second die to a first die, an active side of the first die facing an active side of the second die; and
        bonding a via chip to the first die, the via chip being disposed on a same side of the first die as the second die;
    forming a plurality of via structures on a carrier;
    placing the chip stack on the carrier, the chip stack being disposed between a first via structure of the plurality of via structures and a second via structure of the plurality of via structures; and
    bonding a die structure to the chip stack, the die structure facing a first side of the chip stack, the first side of the chip stack and the active side of the first die facing in opposite directions.

2. The method of claim 1, further comprising, before bonding the die structure to the chip stack, encapsulating the chip stack.

3. The method of claim 1, further comprising forming one or more redistribution layers on a second side of the chip stack, the first via structure, and the second via structure, the second side of the chip stack being opposite the first side of the chip stack.

4. The method of claim 3, wherein the via chip is in electrical contact with the one or more redistribution layers.

5. The method of claim 3, further comprising forming a plurality of connectors on the one or more redistribution layers, the one or more redistribution layers being disposed between the plurality of connectors and the via chip.

6. The method of claim 1, wherein forming the chip stack further comprises encapsulating the second die and the via chip.

7. The method of claim 1, further comprising, before bonding the die structure to the chip stack, de-bonding the carrier from the chip stack.

8. A method comprising:
    forming a chip stack, wherein forming the chip stack comprises:
        attaching a second die to a first die, a first side of the first die facing a first side of the second die, a second side of the first die and a second side of the second die facing in opposite directions, the first side of the first die being opposite the second side of the first die, the first side of the second die being opposite the second side of the second die;
        attaching a via chip to the first die, a first side of the via chip facing the first side of the first die, a second side of the via chip and the second side of the second die facing in a same direction; and
        encapsulating the first die, the second die, and the via chip using a first encapsulant, at least a portion of the first encapsulant being interposed between a third side of the second die and a third side of the via chip, the third side of the second die facing the third side of the via chip, the third side of the second die extending between the first side of the second die and the second side of the second die, the third side of the via chip extending between the first side of the via chip and the second side of the via chip;
    forming a first conductive pillar on a carrier;
    attaching the chip stack to the carrier, the second side of the via chip facing the carrier, the chip stack being disposed adjacent the first conductive pillar; and
    encapsulating the chip stack and the first conductive pillar using a second encapsulant, at least a portion of the second encapsulant being interposed between a first side of the first conductive pillar and a fourth side of the via chip, the first side of the first conductive pillar facing the fourth side of the via chip, the fourth side of the via chip being opposite the third side of the via chip.

9. The method of claim 8, further comprising forming one or more redistribution layers over the second side of the second die and the second side of the via chip.

10. The method of claim 9, wherein the one or more redistribution layers extend over the first encapsulant and the second encapsulant.

11. The method of claim 9, wherein the via chip electrically couples the first die to the one or more redistribution layers.

12. The method of claim 8, further comprising bonding a die structure to the chip stack, the first die being disposed between the via chip and the die structure.

13. The method of claim 12, wherein the die structure is electrically coupled to the first conductive pillar.

14. The method of claim 8, further comprising forming a second conductive pillar on the carrier, the chip stack being disposed between the first conductive pillar and the second conductive pillar.

15. A method comprising:
    forming a chip stack, wherein forming the chip stack comprises:
        bonding a second die to a first die using a plurality of first connector joints;
        bonding a first via chip to the first die using a plurality of second connector joints;
        bonding a second via chip to the first die using a plurality of third connector joints, the plurality of first connector joints, the plurality of second connector joints, and the plurality of third connector joints being disposed on a same side of the first die, the plurality of first connector joints being interposed between the plurality of second connector joints and the plurality of third connector joints; and
        filling a first gap between the second die and the first via chip and a second gap between the second die and the second via chip with a first molding compound;
    forming a first conductive pillar and a second conductive pillar on a carrier;
    bonding the chip stack to the carrier, the chip stack being interposed between the first conductive pillar and the second conductive pillar; and
    filling a third gap between the chip stack and the first conductive pillar and a fourth gap between the chip stack and the second conductive pillar with a second molding compound.

16. The method of claim 15, further comprising bonding a die structure to the chip stack, the first die being disposed between the second die and the die structure.

17. The method of claim 16, further comprising forming one or more redistribution layers over the chip stack, the first conductive pillar and the second conductive pillar, the chip stack being interposed between the die structure and the one or more redistribution layers.

18. The method of claim 17, wherein the first via chip and the second via chip electrically couple the one or more redistribution layers to the first die.

19. The method of claim 17, wherein the first conductive pillar and the second conductive pillar electrically couple the one or more redistribution layers to the die structure.

20. The method of claim 15, further comprising removing the carrier from the chip stack.

* * * * *